(12) United States Patent
Bergsma et al.

(10) Patent No.: US 6,711,396 B1
(45) Date of Patent: Mar. 23, 2004

(54) METHOD TO REDUCE LOCAL OSCILLATOR OR CARRIER LEAKAGE IN FREQUENCY CONVERTING MIXERS

(75) Inventors: Adrian J. Bergsma, Ottawa (CA); Ronald Douglas Beards, Mountain (CA); John Jackson Nisbet, Nepean (CA); Theodore Gregory Carron, Kanata (CA)

(73) Assignee: Nortel Networks Limited, St. Laurent (CA)

( * ) Notice: Subject to any disclaimer, the term of this patent is extended or adjusted under 35 U.S.C. 154(b) by 421 days.

(21) Appl. No.: 09/709,402

(22) Filed: Nov. 13, 2000

(51) Int. Cl.[7] .............................. H04B 1/10; H04B 15/06
(52) U.S. Cl. .................... 455/317; 455/114.2; 455/296; 455/313; 455/323
(58) Field of Search ................................. 455/296, 310, 455/311, 313, 317, 318, 323, 326, 333, 338, 114.2; 327/113

(56) References Cited

U.S. PATENT DOCUMENTS

| 5,532,637 A | 7/1996 | Khoury et al. | |
| 6,516,187 B1 | * | 2/2003 | Williams et al. ............ 455/313 |
| 6,535,725 B2 | * | 3/2003 | Hatcher et al. ............. 455/317 |

FOREIGN PATENT DOCUMENTS

| JP | 409284056 | * | 10/1997 |

OTHER PUBLICATIONS

Laville S., Pontarollo S., Dufaza C., Auvergne D., "Integrated Offset Trimming Technique", ESSCIRC 27 (27th European Solid State Circuits Conference), Villach, Austria, Sep. 18, 2001.

* cited by examiner

Primary Examiner—Quochien Ba Vuong
(74) Attorney, Agent, or Firm—L. Anne Kinsman; Borden, Ladner, Gervais LLP

(57) ABSTRACT

A method and system for reducing local oscillator leakage from radio frequency mixers is disclosed. Compensating circuits are used to reduce or eliminate unwanted leakage from the mixer output signal by controlling the current in individual branches of a balanced input circuit of the mixer. The current is directly controlled by adjusting the voltage on the bases of the differential type amplifier input transistors, or by injecting current directly into the individual branches, or by extracting current directly from the individual branches. The current is also indirectly controlled by increasing the temperature of the mixer components with power dissipation elements that are not connected to the mixer. The compensating circuits are made of different combinations of resistor, transistor and current sink components. By using the compensating circuits with a radio frequency mixer, any DC current differential occurring between two output nodes of the input circuit are reduced or eliminated, resulting in high quality signal transmissions.

28 Claims, 14 Drawing Sheets

METHOD TO REDUCE LOCAL OSCILLATOR OR CARRIER LEAKAGE IN FREQUENCY CONVERTING MIXERS

FIELD OF THE INVENTION

The present invention relates to radio frequency mixers for electrical circuits such as transmitters and receivers. More particularly the invention relates to mixers having reduced LO leakage, mixers having means to reduce LO leakage, methods for producing such mixers and methods for reducing LO leakage of mixers.

BACKGROUND OF THE INVENTION

Mixers are used in a variety of electrical circuits including transmitters and receivers. The demand for such devices has encouraged much activity and competition to produce devices of higher quality at lower prices. Also the increased demand has led in greater use of radio frequencies and the need to transmit and receive signals of greater purity, that is, signals which are contained completely within a particular bandwidth and without any accompanying impure signals which may interfere with bandwidths of other users. For example, a spurious emission is an emission by a user outside the section of the frequency spectrum licensed to that user. Since spurious emissions may affect the transmissions of other licensed users, they are not only undesirable, they may contravene transmission rules. It is well known that mixers routinely produce leakage which, if not dealt with properly, will result in spurious emissions.

Mixers are used in circuits to help process radio signals. A mixer is a radio frequency (RF) circuit that is used to change the frequency of an incoming signal to a different frequency, which may be preferred for signal processing or transmission. Mixers are used in many radio frequency circuits including transmitters and receivers and can ideally be considered as a controlled switch that performs a multiplication of a carrier or local oscillator (LO) signal with an incoming signal.

In practise, such a mixer is commonly implemented as a combination of a switching circuit and an input transconductance circuit. One example of a typical switching circuit and input transconductance circuit is a quad and a differential pair respectively. A diode ring circuit and a balun circuit are another example of a typical switching circuit and input transconductance circuit respectively. The quad switching circuit consists of four transistors connected so that the carrier or LO signal is applied to the bases, and the emitters are connected to the two output branches of the differential pair. The data input signal is applied to the bases of the differential pair with the resulting output current being applied to the emitters of the quad switching circuit. The quad switching circuit then changes the output polarity of the mixer, resulting in a frequency conversion of the output current at the collectors of the quad switching circuit. Ideally, each of the components in one branch has an identical counterpart in the other branch such that the electrical characteristics of one branch are identical to the electrical characteristics of the outer branch. Hence, a current corresponding to the input signals is generated in each branch of the differential pair, and is subsequently multiplied with the LO carrier signal in the quad switching circuit to produce a resulting output signal. In a circuit where the components in one branch of the differential pair are identical to the components in the other branch, the desired output signal is free from LO leakage spure. However, output signals free from LO leakage are difficult to generate because the semiconductor fabrication process inherently introduces variations in the values of the mixer circuit components, leaving the branches of the differential pair mismatched.

It is well known in the art that mixers have an unwanted leakage component, mostly due to process variations during the manufacturing process as mentioned above. Thus, although they provide the desired and expected mixer output signals, the output signal that leaves the mixer almost invariably includes a signal leakage component, specifically, an unwanted component at the LO frequency, called the local oscillator (LO) leakage of the mixer. LO leakage occurs when a DC current differential, also known as a current imbalance or offset current, is formed between the mismatched branches of the differential pair during mixer operation.

Systems such as transmitters and receivers for example, include mixers which must be carefully designed to reduce or remove the LO leakage so that it does not render the circuit impractical, by infringing on other bandwidths for example. In the past, various attempts have been made to eliminate or reduce mixer leakage. One of the most common methods is to use filters following the mixer to filter out the LO leakage. However, the LO leakage is usually produced at a frequency close in the desired target frequency and is consequently difficult to filter out. Additional signal processing employing corrective feedback loops also poses problems. Such loops add a risk of instability to the system, increase the circuit complexity and may require additional software coding to control the circuitry.

However, even the solution of using filters poses serious cost and design problems. For example, although the filter used may reduce the LO leakage signal, it also reduces the strength of the desired signal due to the insertion loss of the filter. The filtered signal then requires further amplification to increase its strength. However, further amplification also amplifies any remnant component of the leakage signal, and additional filtering may be required. Every additional component used in the circuit naturally increases the cost and complexity of the circuit design, which adds further problems for the designer to deal with in order to construct an efficient, economical and practical circuit. Indirect costs, such as higher power consumption and circuit board real-estate consumption by the additional components are also incurred.

During chip manufacturing, although the same process may be used to fabricate each mixer, the output LO leakage will vary from one mixer to another, even within the same batch due to statistical variation of component characteristics. It is standard practice to test each device against desired specifications after manufacturing, and if it does not meet the specifications, it must be discarded. If, after manufacturing, one was to measure the power of the LO leakage, it would be found that the power measurement would vary in a statistical manner. Once a specification for LO leakage has been set, it would be found that the power of the unwanted LO leakage signal from the LO port to the output port would be insignificant within a certain range of DC current differential. Depending on the intended use of the mixer, this range of acceptability may be large or small. However, usually the acceptability would represent a range and thus as long as the LO leakage power could be sufficiently reduced, the mixer would be found acceptable. For many intended uses, when a batch of mixers is manufactured, there will usually be at least several mixers which have acceptably low LO leakage so that no modification is needed. However, for the remainder, if no modification is possible, they are discarded. Thus it usually happens that for a given commercial product with a particular circuit, there is a certain range of acceptability for mixer LO leakage. If a significant proportion of the manufactured mixer device does not meet the required specifications of the system in which it is intended for and are discarded, the overall cost of the final product/commercial article increases.

It is therefore desirable to provide a simple, low-cost circuit and method for reducing mixer LO leakage in radio frequency circuits.

SUMMARY OF THE INVENTION

It is an object of the present invention to obviate or mitigate at least one disadvantage of previous systems and methods for dealing with mixer leakage.

In a first aspect, the present invention provides a mixer for a radio frequency circuit. The mixer has an input circuit, a switching circuit and a compensator circuit. The input circuit is connected to complementary data inputs for providing currents on a first and second output node respectively. The switching circuit is connected to complementary local oscillator inputs and the first and second output nodes for driving complementary mixer output nodes. The compensator circuit controls a DC current differential between the first and second output nodes to reduce local oscillator leakage power at the complementary mixer output nodes.

In an embodiment of the present invention, the input circuit includes a differential pair having first and second current branches, and the switching circuit includes a switching quad. In an aspect of the present embodiment, the compensator circuit is connected to the first and second output nodes, and the compensator circuit injects current into at least one of the first and second output nodes. In the present aspect, the compensator circuit includes at least one transistor and at least one current sink for controlling the injected current from the current sink, where the at least one transistor receives a bias voltage. The at least one transistor can be an npn BJT, and the voltage supply can be VEE. Alternatively, the at least one transistor can be a pnp BJT, and the voltage supply can be VCC. In other aspects of the present embodiment, the input circuit includes a balun circuit or a common base pair. The common base pair includes first and second current sinks which are variable for controlling the DC current differential.

In another aspect of the present embodiment, the first and second branches receive current from first and second current sinks respectively, where the first and second current sinks are variable for controlling the DC current differential.

In another aspect of the present embodiment, the compensator circuit is connected to the complementary data inputs, and changes a DC voltage level of the input signals. In the present aspect, the compensator circuit includes at least one resistor for selectively connecting to ground and an anti-fuse for selectively connecting the at least one resistor to ground. The compensator circuit can alternatively include a buffer circuit configured as a differential pair.

In yet another aspect of the present embodiment, the compensator circuit selectively changes the resistance of at least one of the first and second current branches.

In another embodiment of the present invention, the compensator circuit includes at least one power dissipation element for generating heat. The at least one power dissipation element includes at least one resistor connected to VCC for selectively connecting to ground, and an anti-fuse for selectively connecting the at least one resistor to ground. In another aspect of the present embodiment, the at least one power dissipation element includes at least one transistor and at least one current sink serially connected between the resistor component and ground, where the at least one transistor receives a bias voltage.

A further aspect of the present invention provides a radio frequency transmitter. The radio frequency transmitter includes a digital to analog converter, a filter, a mixer and an antenna. The digital to analog converter receives digital data and generates an analog data signal corresponding to the digital data. The filter receives the analog data signal and provides a filtered data signal to the mixer. The mixer changes the frequency of the filtered data signal in accordance with a high frequency local oscillator, and provides a high frequency data signal. The antenna transmits the high frequency data signal. The mixer has an amplifier circuit, a switching circuit and a compensator circuit. The amplifier is connected to complementary data inputs circuit for providing currents on a first and second output node respectively. The switching circuit is connected to complementary local oscillator inputs and the first and second output nodes for driving complementary mixer output nodes. The compensator circuit is operatively connected to the amplifier circuit for reducing a DC current differential between the first and second output nodes to reduce local oscillator leakage power at the complementary mixer output nodes.

In yet a further aspect of the present invention, there is provided a method for mixing a data input signal with a local oscillator frequency for converting the frequency of the data input signal to the frequency of the local oscillator. The method includes the steps of providing a local oscillator signal to a mixer, and applying a compensator current to the mixer to reduce local oscillator leakage.

BRIEF DESCRIPTION OF THE DRAWINGS

Embodiments of the present invention will now be described, by way of examples only, with reference to the attached Figures, wherein.

DETAILED DESCRIPTION

Figure 1:
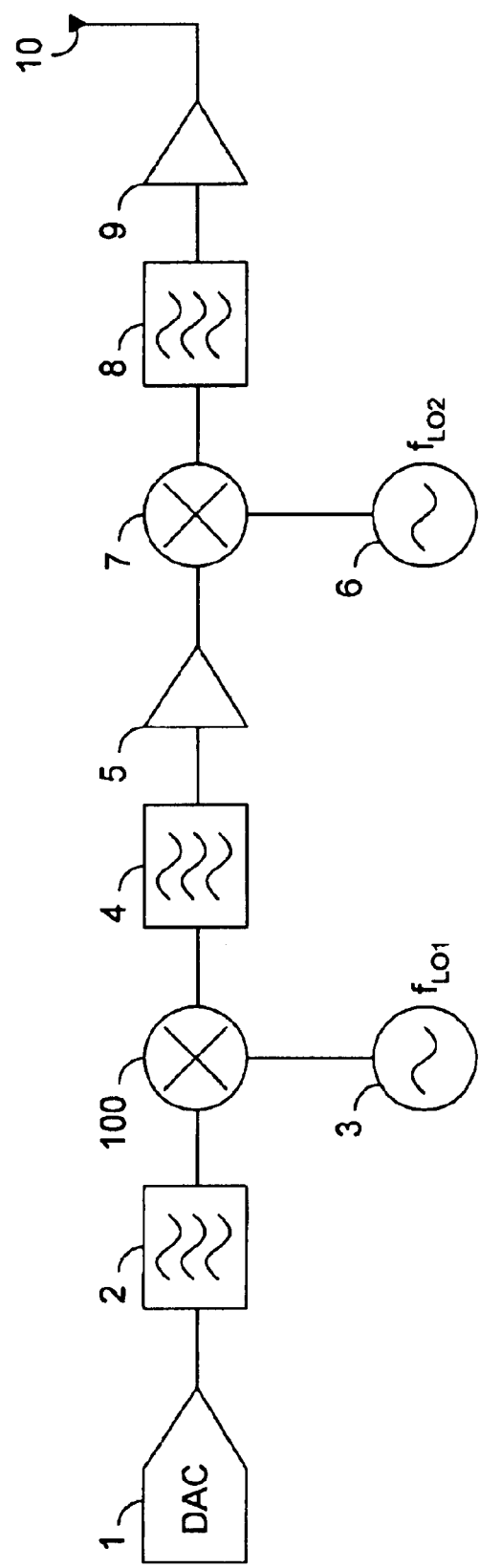
FIG. 1 is a schematic of a conventional transmitter system of the prior art.

Generally, the present invention provides a method for reducing or eliminating LO leakage from a mixer, and mixers with a compensator circuit to reduce or eliminate LO leakage. More specifically, extraction of current from the mixer, injection of current into the mixer, and changing the resistance in the current paths of the mixer, are methods by which the compensator circuits of the present invention affect the current of the mixer in order to reduce or eliminate LO leakage.

It is not usually necessary to determine the exact value of the LO leakage for any given mixer. Since mixer components are made in large numbers, and since each mixer may have a unique LO leakage value, it is more cost effective to estimate the LO leakage value as falling within a range of values.

A conventional computer simulator program is used to obtain a workable estimate for the LO leakage value. For any given mixer circuit, the values of the components in the differential pair are known. Also, it is possible to know the range of values possible for a given component, as extracted from a manufacturer's specifications for example. By example, a particular resistor used in the circuit is supposed to be identical to the matching resistor on the mirror image side of the circuit. However, in practice, there is usually some variation, even though small, between the two resistors. The possible variation of values is either determined directly by measurement, or from the manufacturer's specifications. That maximum variation is then inserted into the simulator program by assigning one of the matching resistors its minimum expected value, and the other of the matching resistors its maximum expected value. By doing this for each component, it is possible to obtain an accurate estimate of the range of values for the output LO leakage power. The mixer circuit is then designed with a compensating circuit of appropriate values to provide sufficient compensation to bring a desired proportion of mixers from outside the acceptable range of LO leakage to within the acceptable range. Thus the number of components which fail to meet requirements for a given circuit is reduced. Also, it is possible to produce mixers having sufficiently low LO leakage so that it is possible to modify the other system components in the system for which the mixer is intended, resulting in a usable system. In some cases, such modification may permit dispensing with the need for one or more system components, or it may permit using less reliable and less expensive system components.

It has been found that unwanted LO leakage is generated within the mixer when a DC (direct current) current differential between the two internal output nodes of the mixers' input circuit occurs. Therefore, the LO leakage in the mixer is reduced or eliminated by compensating for the DC current differential. It has been found that once this current differential is reduced or eliminated, the unwanted LO leakage of the mixer output signal is accordingly reduced or removed.

FIG. 1 shows a block diagram of a typical transmitter system employing a mixer. The transmitter of FIG. 1 is commonly used in base stations for wireless applications, and generally includes a digital-to-analog converter 1 (DAC), filters 2, 4 and 8, mixers 100 and 7, local oscillators 3 and 6, amplifiers 5 and 9, and an antenna 10. The following description illustrates the general operation of the transmitter, and references to specific frequencies used are by example only, since different transmitter systems employ different frequency schemes. DAC 1 converts digital data into an analog signal, at a frequency of 5 MHz. Filter 2 removes undesired components from the analog signal, and the resulting filtered analog signal is provided to a mixer 100. Mixer 100 combines the analog signal with a first carrier signal FLO1 having a frequency of 150 MHz, generated by local oscillator 3. Since mixer 100 generates a signal with LO leakage, an additional filter 4 is employed to reduce the LO leakage. Since filter 4 has the effect of dampening the power levels of the desired signal, an amplifier 5 is used to boost the signal to appropriate power levels. Mixer 7 combines the amplified signal with a second carrier signal FLO2 having a frequency of 2.5 GHz, generated by local oscillator 6. Mixer 7 also introduces LO leakage, which must be filtered out by filter 8. Similar to filter 4, filter 8 dampens the power level of the signal, hence amplifier 9 is used to boost the signal to the appropriate power levels for transmission through the antenna 10. It is noted that the filter-amplifier circuit combinations of 4, 5 and 8, 9 are included primarily to reduce the LO leakage introduced by mixers 100 and 7 respectively.

Figure 2:
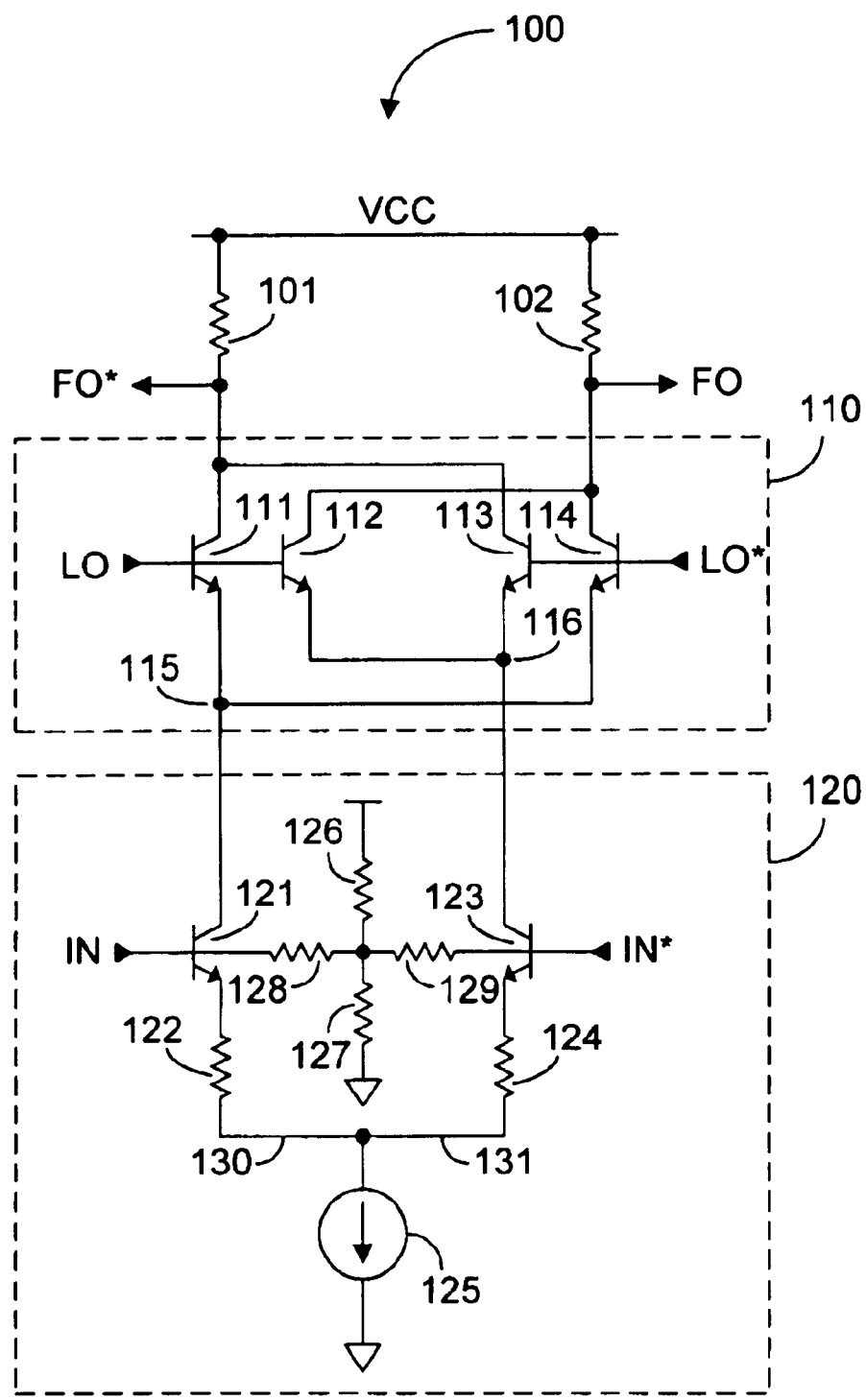
FIG. 2 is a circuit schematic of a conventional mixer of the prior art.

FIG. 2 illustrates a conventional Gilbert mixer previously disclosed in U.S. Pat. No. 5,532,637, the contents of which are incorporated herein by reference. Mixer 100 includes a switching circuit 110 and an input circuit 120. The switching circuit 110 is a conventional switching quad unit connected to a load circuit. The input circuit 120 is a conventional differential amplifier circuit. All transistors shown in FIG. 2 are npn bipolar junction transistors, each having a base, collector and emitter node. A description of the differential amplifier input circuit follows. A current sink 125, also called a current source, is serially connected between VEE, typically ground, and the common first terminal of parallel connected resistors 122 and 124. The second terminal of resistor 122 is connected to the emitter of transistor 121, and the second terminal of resistor 124 is connected to the emitter of transistor 123. The base of transistor 121 receives data input signal IN and the base of input transistor 123 receives the complementary data input signal IN*, and the collectors of transistors 121 and 123 are connected to nodes 115 and 116 respectively. Nodes 115 and 116 are the internal data output nodes of the input circuit 120 and the internal data input nodes of switch circuit 110. Other components in the amplifier circuit shown in FIG. 2 are resistors 128, 129, 127 and 126. Resistors 128 and 129 are serially connected between the bases of input transistors 121 and 123, and set the differential input impedance levels between bases of transistor 121 and 123. Resistor 127 couples voltage supply VEE to the common terminal of resistors 128 and 129, and resistor 126 couples the same common terminal to the VCC voltage supply. Resistors 127 and 126 form a voltage divider that sets the DC level of the bases of input transistors 121 and 123. The switching circuit 110 consists of a quad transistor switching unit of four transistors 111, 112, 113 and 114 which receive local oscillator signal LO at the bases of transistors 111 and 112 and the complementary local oscillator signal LO* at the bases of transistors 113 and 114. More specifically, the collector of transistors 111 and 113 are connected in common to a mixer output node FO* and the collector of transistors 112 and 114 are connected in common to the complementary mixer output node FO. The base of transistors 111 and 112 are connected in common to LO, and the base of transistors 113 and 114 are connected in common to LO*. The emitters of transistors 111 and 114 are connected in common to node 115, and the emitters of transistors 112 and 113 are connected in common to node 116. Nodes 115 and 116 are the data signal inputs to the switching circuit 110. The load circuit includes resistors 101 and 102, connected between VCC and mixer output nodes FO* and FO respectively.

The general operation of mixer circuit 100 from FIG. 2 is now described. DC current from a current sink 125 is divided into two branches 130 and 131. The current of branch 130 passes through resistor 122, transistor 121 and is applied to switching circuit 110 at node 115. The current of the second branch 131 passes correspondingly through resistor 124 and transistor 123, and is applied to switching circuit 110 at node 116. Data input signals IN and IN*, applied to the buses of input transistors 121 and 123 respectively, allows these DC currents to be modulated in a linear fashion resulting in an output signal current to be applied at nodes 115 and 116. The switching circuit 110 alternately drives the mixer output nodes FO and FO* with the current from branches 130 and 131 in accordance with the frequency of LO. With reference to the transmitter system of FIG. 1 by example, LO is supplied by local oscillator 3, and is hence, a fixed frequency signal. The DC current differential is created by the physical limitations of the components in the two branches 130 and 131. That is, although the components used in each branch are supposed to be identical, process variations during semiconductor manufacturing introduces discrepancies between the actual values of each supposedly "identical" component. Even though such discrepancies may be small, there is a resulting DC current differential between nodes 115 and 116. This DC current differential has been found to be a cause of LO leakage generated at the outputs FO and FO* of mixer 100. Once this LO leakage signal component is generated, it then becomes an unwanted component that propagates throughout the system of which the mixer is a part. The LO leakage signal has to be filtered out or otherwise minimised to prevent its interference in the proper function of the system.

Although a differential amplifier is the input circuit 120 for mixer 100, there are other conventional input circuits that provide input currents to nodes 115 and 116 of the switching circuit 110. Examples of further conventional input circuits 120 for use in the mixer 100 of FIG. 2 are shown in FIGS. 3 to 6. Any of the following input circuits 120 are suitable substitutes for the differential amplifier circuit of FIG. 2 at nodes 115 and 116 of the switching circuit 110.

Figure 3:
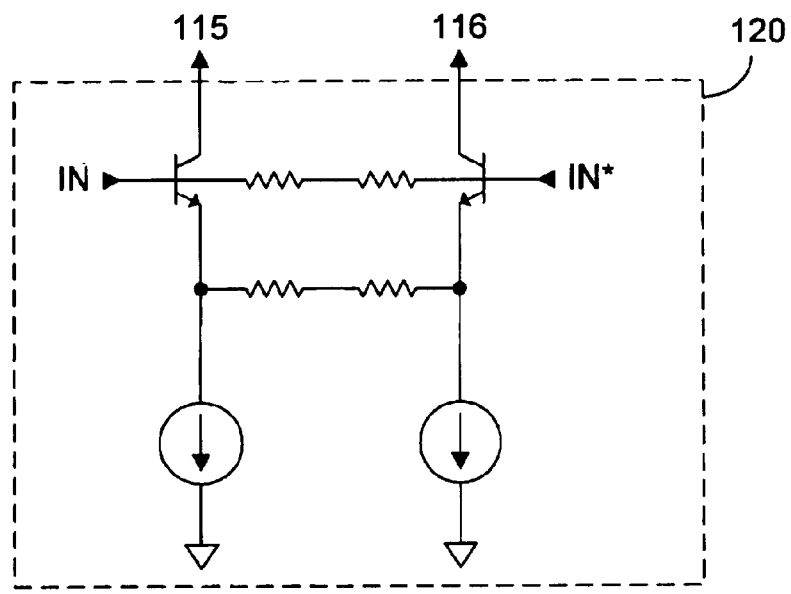
FIG. 3 is a circuit schematic of a conventional input circuit of the prior art.

FIG. 3 illustrates a circuit schematic of an alternate differential amplifier input circuit 120 similar to the differential amplifier circuit shown in FIG. 2. However, instead of dividing current into two branches from a single current sink, the differential amplifier circuit of FIG. 3 has two separate current sinks, each for supplying current to its respective current branch.

Figure 4:
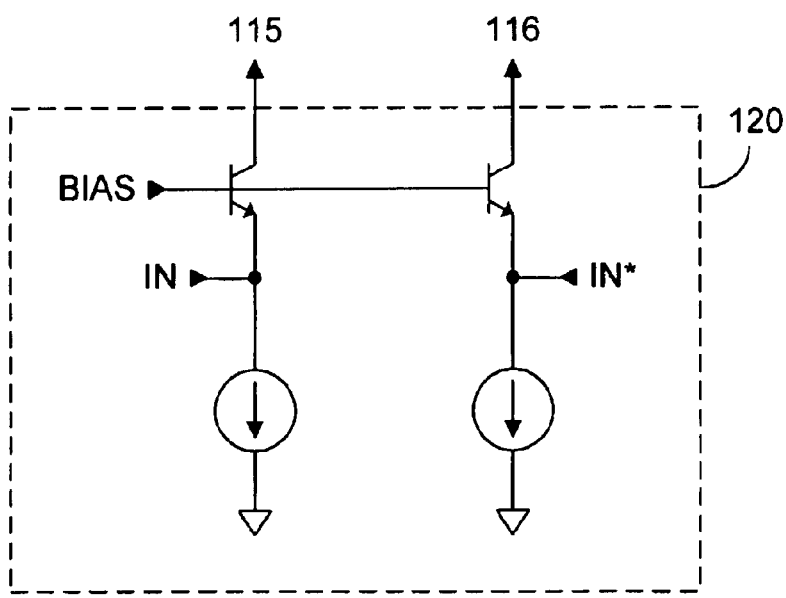
FIG. 4 is a circuit schematic of a conventional input circuit of the prior art.

FIG. 4 is a circuit schematic of a common base stage input circuit 120. The configuration is similar to the alternate differential amplifier circuit of FIG. 3, except that the transistors receive bias, and the complementary input signals IN and IN* are received at the emitters of the transistors. Separate bias signals can be connected to the bases of the transistors instead of the common bias signal connected to the bases of both transistors.

Figure 5:
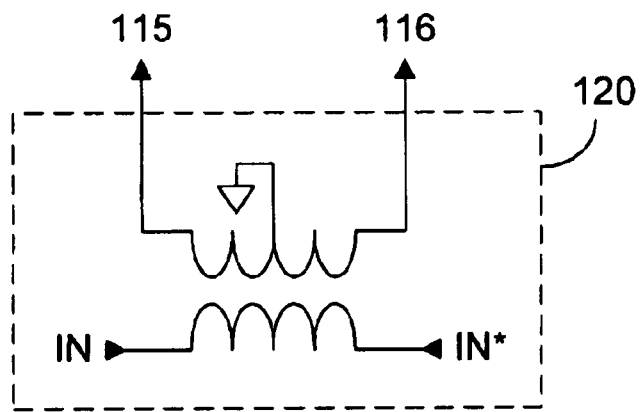
FIG. 5 is a circuit schematic of a conventional input circuit of the prior art.

FIG. 5 is a circuit schematic of a balun input circuit 120 commonly used in low voltage applications. The balun includes a first inductor for receiving the complementary input signals IN and IN*, and a second inductor for providing the output current to nodes 115 and 116. It will be understood by those skilled in the art that the inductor centre tap to VEE can be substituted with a current sink to properly bias the circuit, depending on the application of the circuit.

Figure 6:
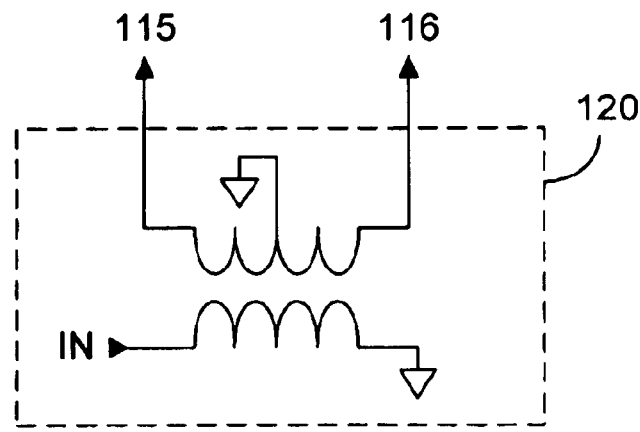
FIG. 6 is a circuit schematic of a conventional input circuit of the prior art.

FIG. 6 is a circuit schematic of an alternate balun input circuit 120, similar to the balun input circuit 120 of FIG. 5. However, the second inductor receives one input signal IN instead of complementary input signals.

Since the alternate input circuits 120 shown in FIGS. 3 to 6 provide currents to the switching circuit 110 of the mixer 100, the same problems described for the mixer of FIG. 2 equally apply to mixers employing any of the input circuits 120 shown in FIGS. 3 to 6.

Figure 7:
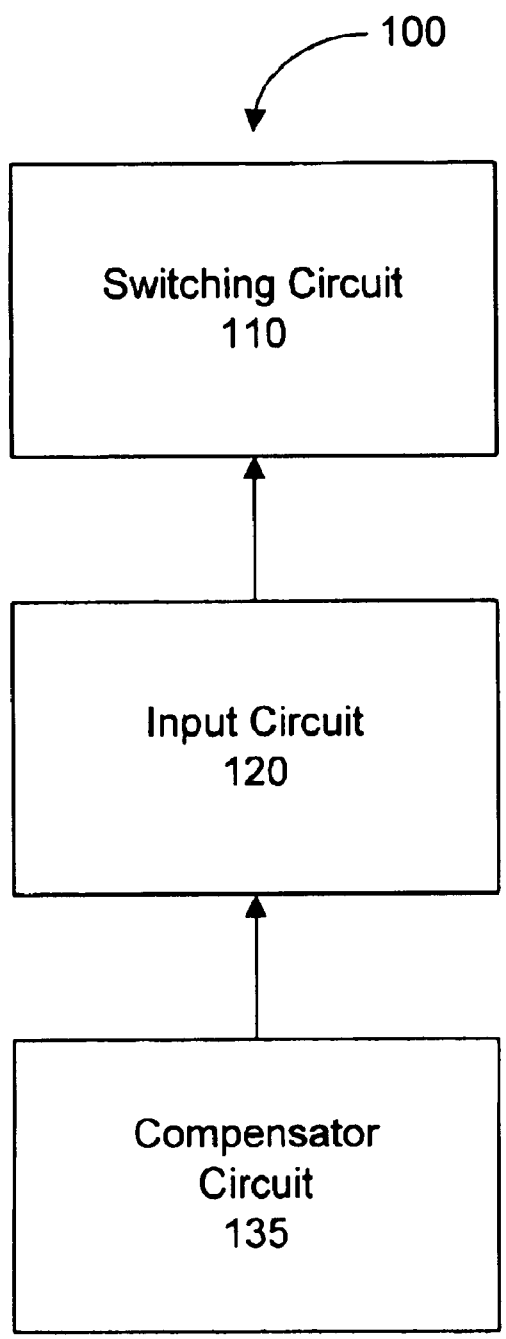
FIG. 7 is a block diagram of a mixer according to the invention.

FIG. 7 shows a block diagram of the mixer according to the present invention. Mixer 100 of FIG. 7 includes compensator a circuit 135 for controlling the DC current differential in the input circuit 120 directly through additional circuit connections, or indirectly through changes in the mixer environment temperature. Mixer 100 can be the mixer circuit of FIG. 2, or a mixer having a switching circuit 110 combined with any of the conventional input circuits 120 shown in FIGS. 3 to 6. The various embodiments of the compensator circuit 135 described below disclose circuits and methods for reducing the DC current differential in the input circuit by controlling the DC current in the input circuit 120.

FIGS. 8 to 12 illustrate direct compensator circuit embodiments of the present invention for reducing the LO leakage output power of a mixer. In the embodiments of FIGS. 8 to 12, current in the input circuit 120 is affected by the compensator circuit such that any DC current differential between nodes 115 and 116 of the switching circuit is reduced.

Figure 8:
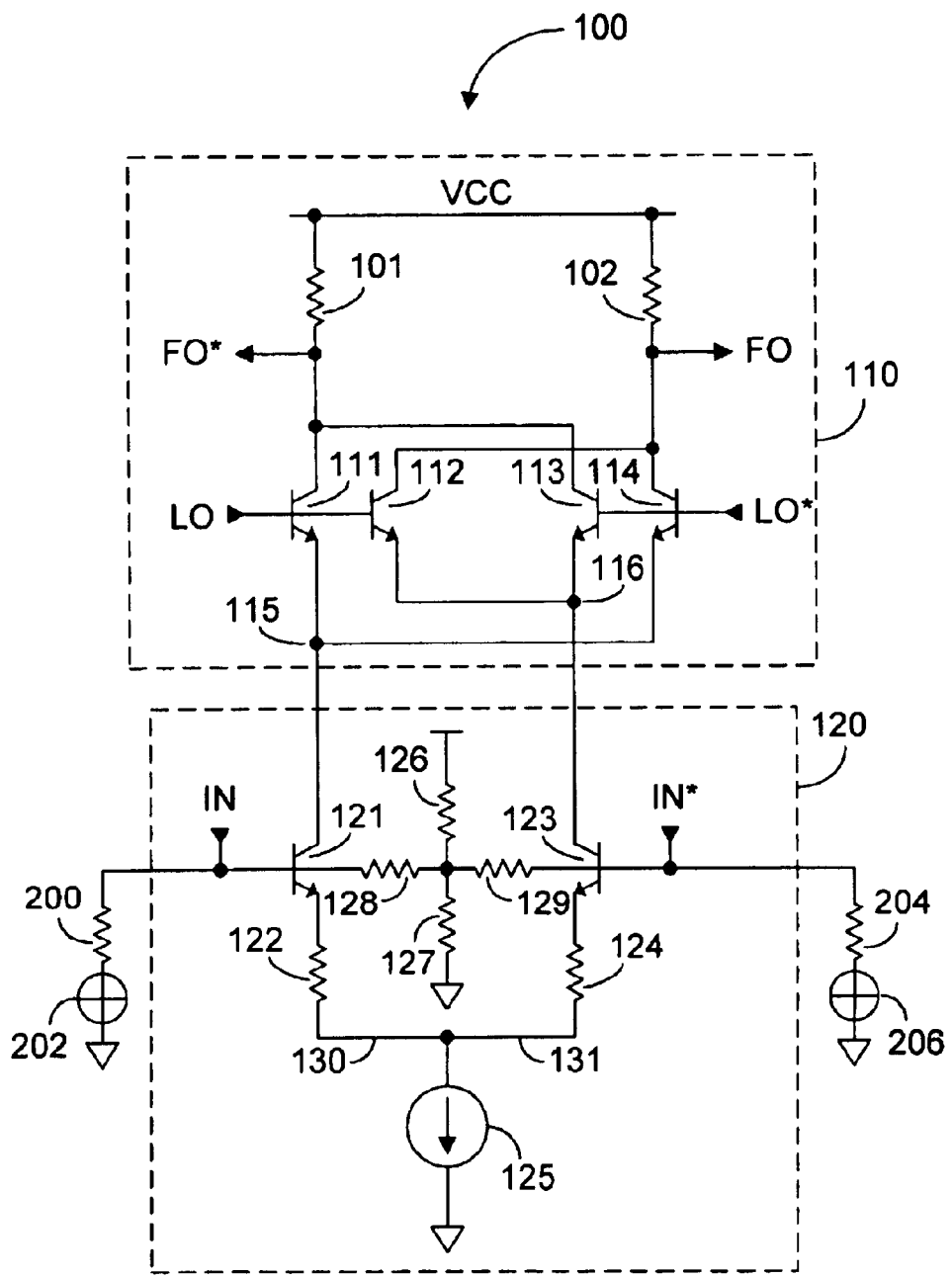
FIG. 8 is a circuit schematic of a directly compensated mixer according to an embodiment of the invention.

FIG. 8 shows a mixer according to an embodiment of the present invention. The impedance devices, switching circuit 110 and the input circuit 120 are the same as in FIG. 2, and correspondingly, their components are also the same. However, the mixer shown in FIG. 8 is connected to compensator circuits for controlling the current through branches 130 and 131. The compensator circuits include resistor components 200 and 204 and anti-fuse components 202 and 206. Resistor 204 and anti-fuse 206 are connected in series between the base of input transistor 123 and ground, and resistor 200 and anti-fuse 202 are similarly connected in series between the base of input transistor 121 and ground. After manufacturing, the mixer is usually tested for LO leakage. If the LO leakage output power is too high, then either one, or both resistor components are selectively connected to ground by blowing the corresponding anti-fuses, depending on the desired circuit performance. Anti-fuses and methods for blowing anti-fuses are well known in the art, and effectively create an open circuit between its two nodes in the unblown state, and a short circuit between its two nodes in its blown state. The value of each resistor is predetermined, and when connected to ground via its corresponding blown anti-fuse, reduces the DC voltage level of the input signal appearing on the base of the corresponding input transistor. Therefore, the current provided by that corresponding input transistor is reduced by an incremental amount related to the resistor value. Consequently the DC current differential in the mixer is reduced to an acceptable level, and the LO leakage output power is correspondingly reduced. If the values of the resistors 200 and 204 are not the same, at least three possible connection combinations exist to choose from. Although FIG. 8 shows one resistor and anti-fuse compensator circuit connected to the base of each input transistor 121 and 123, a plurality of such compensator circuits can be connected in each input transistor base to form a parallel resistor array. Each resistor can have the same value, or an incrementally different value. Such an arrangement allows for fine control of the DC current in each branch 130 and 131 of the amplifier circuit 120.

Because the DC current differential of a mixer circuit varies from circuit to circuit in the same batch, and between different batches, the DC current differential of any given mixer circuit is not accurately predicted. However, the value of the DC current differential for any given batch can be fairly estimated to give a range of possible values. For many uses of mixer components, it is not necessary that the DC current differential value is zero. It is only necessary that the DC current differential value is small enough to bring an economically feasible number of the circuits in a given production batch into an acceptable range. That is, if one plots the value of the offset DC current differential against the value of the power of the LO leakage signal, a graph is obtained which shows that for some values of the DC current differential, the power of the LO leakage signal is too low to have any negative consequences to the system for which it is intended. Therefore, the value of resistors 200 and 204 are chosen so that the DC current differential value is reduced to a value for which the LO leakage is insignificant. Further, it is possible to test the value of the LO leakage output power for each connection combination in the circuit of FIG. 8 before the resistors are permanently connected. One method is to create and connect a probe pad between the shared terminals of the resistor and anti-fuse of each compensator circuit, such that a test probe supplying the ground potential in contact with the probe pad simulates a blown anti-fuse. Another method is to connect a grounding transistor in parallel with each anti-fuse, where a register controls each transistor. During testing, different bit patterns are loaded into the registers to identify the anti-fuses that should be blown in order to minimise the DC current differential. In this way it is possible to select the best connection combination for each mixer circuit and salvage many more of the mixer circuits of a given batch that would have been discarded if the compensation circuit was not used.

Figure 9:
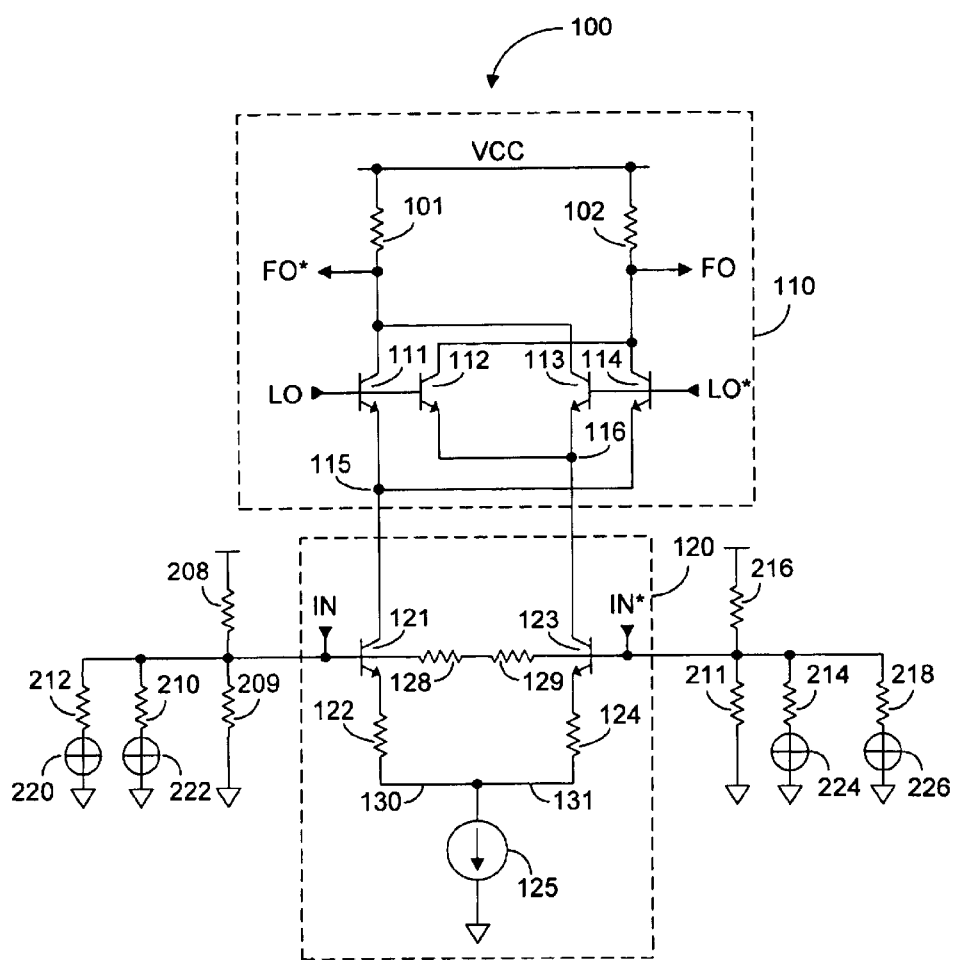
FIG. 9 is a circuit schematic of a directly compensated mixer according to an embodiment of the invention.

FIG. 9 shows a mixer according to another embodiment of the present invention. The impedance devices and switching circuit 110 are the same as in FIG. 2, and correspondingly, their components are also the same. The input circuit 120 is substantially the same as in FIG. 2, except that resistors 127 and 126 for setting the DC level of the bases of input transistors 121 and 123 in FIG. 2 are not included, for reasons which are described in further detail later. A different compensating circuit is shown in the mixer of FIG. 9. The compensator circuit of the present embodiment includes resistor components 208, 210, 212, 214, 216, 218 and anti-fuse components 220, 222, 224, 226. Resistors 210, 212, 214 and 218 are selectively connectable to ground via corresponding anti-fuses 220, 222, 224 and 226 respectively, to provide a DC bias voltage on the base of input transistors 121 and 123. A first compensator circuit includes resistor 208 connected between VCC and the base of transistor 121, resistor 209 connected between the base of transistor 121 and ground, resistor 210 and anti-fuse 222 serially connected between the base of transistor 121 and ground, and resistor 212 and anti-fuse 220 serially connected between the base of transistor 121 and ground. A second compensator circuit identical to the first compensator circuit includes resistor 216 connected between VCC and the base of transistor 123, resistor 211 connected between the base of transistor 123 and ground, resistor 214 and anti-fuse 224 serially connected between the base of transistor 123 and ground, and resistor 218 and anti-fuse 226 serially connected between the base of transistor 123 and ground. The first and second compensator circuits are arranged in a voltage divider configuration, and each provide a DC bias voltage on the bases of input transistors 121 and 123. By adjusting this DC bias voltage, the resistive value of input transistors 121 and 123 is also adjusted, which in turn controls the current at nodes 115 and 116. It is apparent to those skilled in the art that the first and second compensator circuits function as a bias network. This means that the voltage divider of resistors 126 and 127 that sets the DC level of the bases of input transistors 121 and 123 in FIG. 2 are not needed for the mixer of the present embodiment, and can be omitted if desired. The DC bias voltage generated by the first and second compensator circuits is adjusted by selectively connecting resistors 210, 212, 214 and 218 to ground by blowing their respective anti-fuses 220, 222, 224 and 226. In the present embodiment, the values of resistors 210 and 212 of the first compensator circuit decrease in fixed, known increments. The same decrease in fixed, known increments also applies to resistors 214 and 218 of the second compensator circuit. This allows for finer control of the bias voltage applied to the bases of input transistors 121 and 123. In an alternate embodiment, the values of resistors 210, 212 and 214, 218 have the same values. During a testing phase after the mixer circuit is fabricated, a programming algorithm measures the LO leakage output power from the mixer circuit. The appropriate combination of anti-fuse are blown from the first and second compensator circuits, such that the DC current differential is reduced, hence reducing the LO leakage output power to acceptable levels. As with the mixer circuit of FIG. 8, a plurality of resistor and anti-fuse circuit combinations in the form of a parallel resistor array can be used to obtain even finer control of the applied bias voltage to the bases of the input transistors. Accordingly, the same process and apparatus for testing and simulating the results of blown fuse combinations previously described for the mixer of FIG. 8 can also be used for the mixer circuit of FIG. 9.

It is seen that in the above variations, the compensating circuit adjusts the current at nodes 115 and 116 by applying a DC bias voltage to the bases of the input transistors of the differential pair input circuit. Multiple parallel-connected resistors adjust this bias voltage in discrete steps, where the number of discrete or digital steps available will depend on the number of additional resistors and the resistor value scheme. Unfortunately, to attain a fine level of granularity, many resistors are required, which has the disadvantage of occupying significant chip area as well as adding programming complexity.

Figure 10:
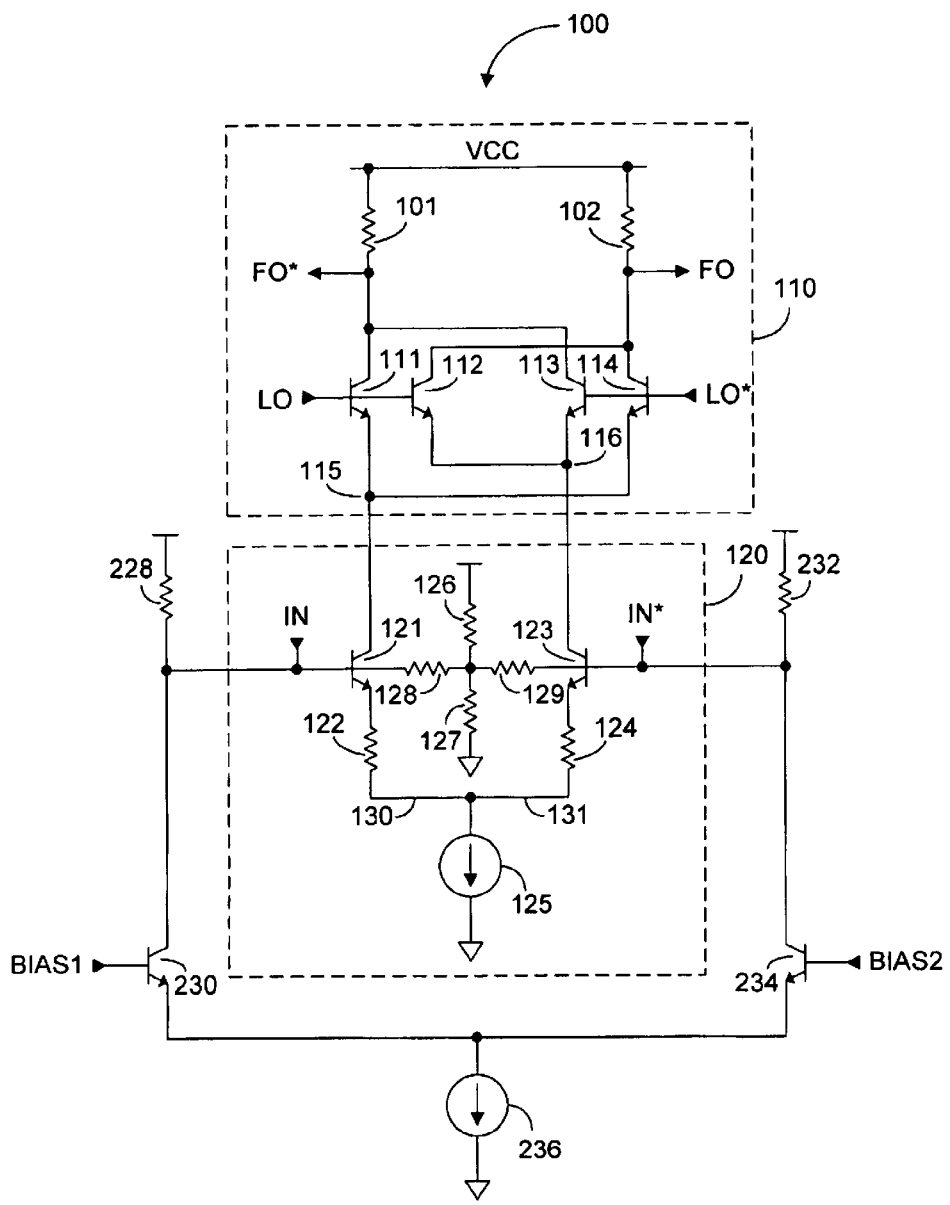
FIG. 10 is a circuit schematic of a directly compensated mixer according to an embodiment of the invention.

However the embodiment shown in FIG. 10 illustrates that a continuous or analog adjustment is also possible, according to another embodiment of the present invention. The impedance devices, switching circuit 110 and the input circuit 120 are the same as in FIG. 2, and correspondingly, their components are also the same. The compensator circuit of the present embodiment is a buffer circuit connected to the bases of input transistors 121 and 123. The buffer circuit includes resistor components 228 and 232, bias transistors 230 and 234, and current sink 236. Resistor 228 and bias transistor 230 are connected in series between VCC and the first common terminal of current sink 236. The collector of bias transistor 230 is connected to the base of input transistor 121. Mirrored for input transistor 123, resistor 232 and bias transistor 234 are connected in series between VCC and the first common terminal of current sink 236. The collector of bias transistor 234 is connected to the base of input transistor 123. The bases of bias transistors 230 and 234 receive bias voltages BIAS1 and BIAS2 respectively, and the second terminal of current sink 236 is connected to VEE. Thus, by controlling the DC voltage of BIAS1 and BIAS2, the DC voltage range applied to the bases of input transistors 121 and 123 are swept, and are adjustable in a stepwise or continuous fashion to obtain a series of voltage ranges. BIAS1 and BIAS2 can be connected to a parallel resistor array as previously described for the embodiments of FIGS. 8 and 9. In an alternate embodiment, BIAS1 and BIAS2 are external voltages set by the user for manual adjustment of the current at nodes 115 and 116. In another alternate embodiment, BIAS1 and BIAS2 are signals generated by a feedback circuit within the system for self-adjustment of the current at nodes 115 and 116 of the mixer circuit 100. In yet another alternate embodiment, BIAS1 and BIAS2 are digital signals which can turn off either one of transistors 230 and 234 so that the total current from current sink 236 is applied to the bases of either one of input transistors 123 and 121 respectively. Since the voltages of these additional circuits are transmitted to branches 130 and 131 by way of the output currents of transistors 121 and 123, a range of compensating current values can be provided at nodes 115 and 116 to obtain the lowest DC current differential. As previously mentioned, this particular embodiment of the mixer allows users to tailor the level of LO leakage output power through the application of a direct voltage off chip. Because of the difficulty in generating fine voltages off-chip, the buffer circuit components are sized in scale any voltage level appearing on BIAS1 and BIAS2 by a desired factor. For example, the bias voltage appearing on the base of input transistor 121 can be scaled to one half of the voltage of BIAS1. Although not shown, degeneration resistors can be inserted in series between the emitters of bias transistors 230 and 234, and the current sink 236. This allows for analog operation of the compensator circuit with a reduced range.

The above embodiments allow for adjustment of the current at nodes 115 and 116 of the input circuit 120 by adjusting the DC voltage appearing on the bases of its input transistors 121 and 123 to reduce any DC current differential appearing between nodes 115 and 116. Unfortunately, the additional components connected to the bases of the input transistors contribute noise and additional parasitics to the circuit which are undesirable. Additionally, since it is the differential or offset current produced by the differential pair and transmitted to the switching circuit which is important, it is seen that the compensating current can also be provided directly by a compensating circuit.

Figure 11:
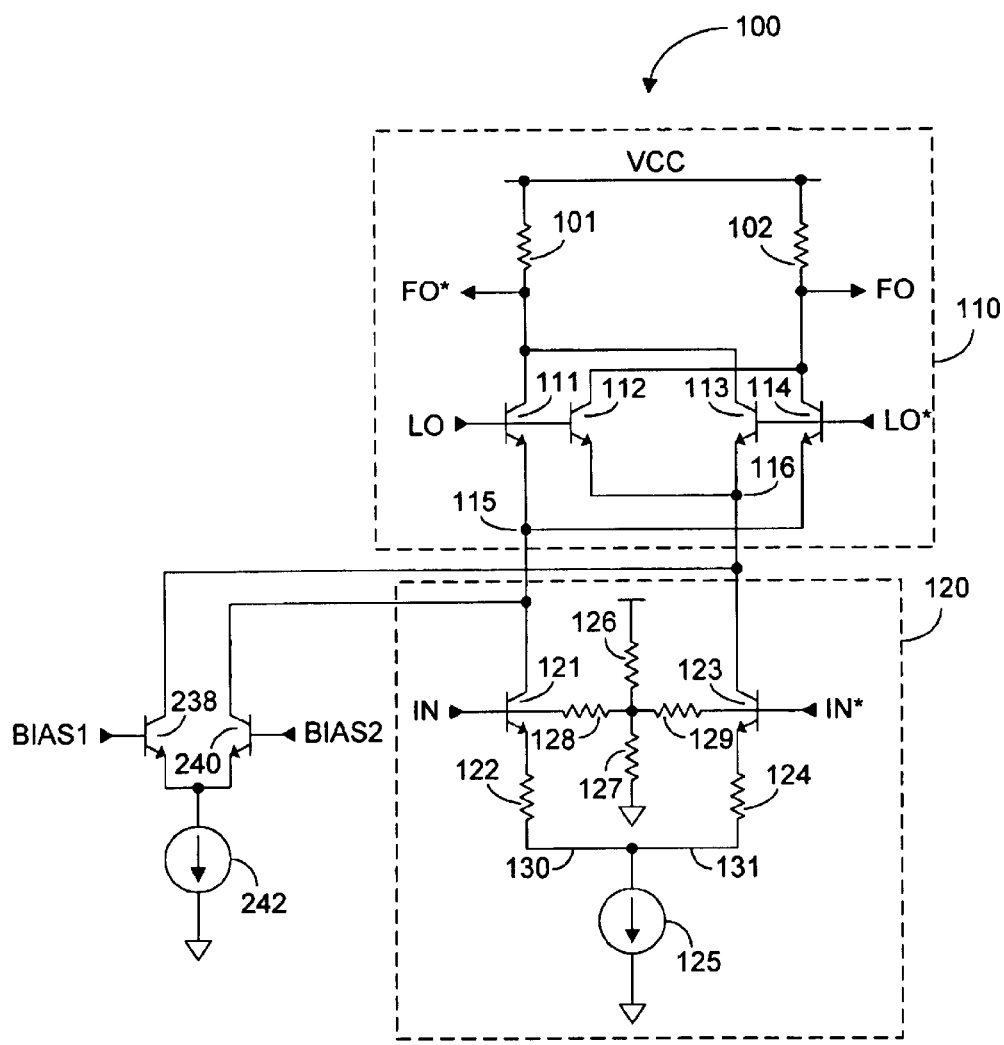
FIG. 11 is a circuit schematic of a directly compensated mixer according to an embodiment of the invention.

FIG. 11 shows a compensator circuit according to another embodiment of the present invention. The compensator circuit of the present embodiment extracts current directly from the internal output nodes of the input circuit for reducing the DC current differential. Hence, the extracted current is called a compensating current. The impedance devices, switching circuit 110 and the input circuit 120 are the same as in FIG. 2, and correspondingly, their components are also the same. The compensator circuit of the present embodiment includes a current sink 242 and bias transistors 238 and 240. Current sink 242 has a first terminal connected to the common emitters of bias transistors 240 and 238, and a second terminal connected to VEE, typically ground. The collectors of transistors 240 and 238 are connected to nodes 115 and 116 respectively, and their bases are connected to bias voltages BIAS1 and BIAS2 respectively.

BIAS1 and BIAS2 can be controlled in the same manner as previously described for the previous mixer embodiment of FIG. 10. With this compensator circuit, current is extracted directly from the branches of input circuit 120 at nodes 115 or 116. To attain circuit balance, current is extracted from both nodes 115 and 116 until both nodes have approximately the same DC current value, and any DC current differential occurring as a result of component variation in the input circuit 120 is reduced. In contrast to the mixer circuit of FIG. 10 where the compensator circuit sweeps a range of voltage on the input transistor bases, the compensator circuit of FIG. 11 sweeps a range of extracted current. By controlling the voltage levels of BIAS1 and BIAS2 at the bases of transistors 240 and 238, continuous adjustment of the DC current differential is provided through a range of compensating currents. Although the DC current differential is not directly measured, a measured low LO leakage output power level indicates a low DC current differential. In this embodiment, the compensator circuit is very small, and the current sink 242 is designed to be very precise for extracting a small current. For example, the current sink 242 has a value of about three micro amps, to provide a very well controlled source of compensating current. It is then possible to known with some precision the value of the compensating current. In an alternate embodiment, bias transistors 238 and 240 are substituted by anti-fuses for connecting nodes 115 and 116 to the first terminal of a controlled current sink 242. In another alternative embodiment, a plurality of compensator circuits can be connected in parallel to nodes 115 and 116, each having a current sink of a different current value. Hence, by selectively enabling one of the parallel connected compensator circuits, a different range of current is extracted from nodes 115 and 116 for the same bias voltages.

In a modification of the mixer embodiment of FIG. 11, the compensator circuit is inverted such that the bias transistors are pnp transistors instead of npn transistors, and the current sink is connected to VCC instead of VEE. In the present embodiment, current is injected at nodes 115 and 116 of the mixer circuit. In an alternate embodiment, a first resistor and a first npn transistor are serially connected between node 115 and VCC, and a second resistor and a second npn transistor are serially connected between node 116 and VCC. The injected current is controlled by adjusting the respective base voltages of the first and second npn transistors. In yet another alternate embodiment, the previously mentioned first and second npn transistors are replaced with direct connections to respective externally controlled voltages, and injected current is controlled by adjusting the respective externally controlled voltage levels.

Figure 12:
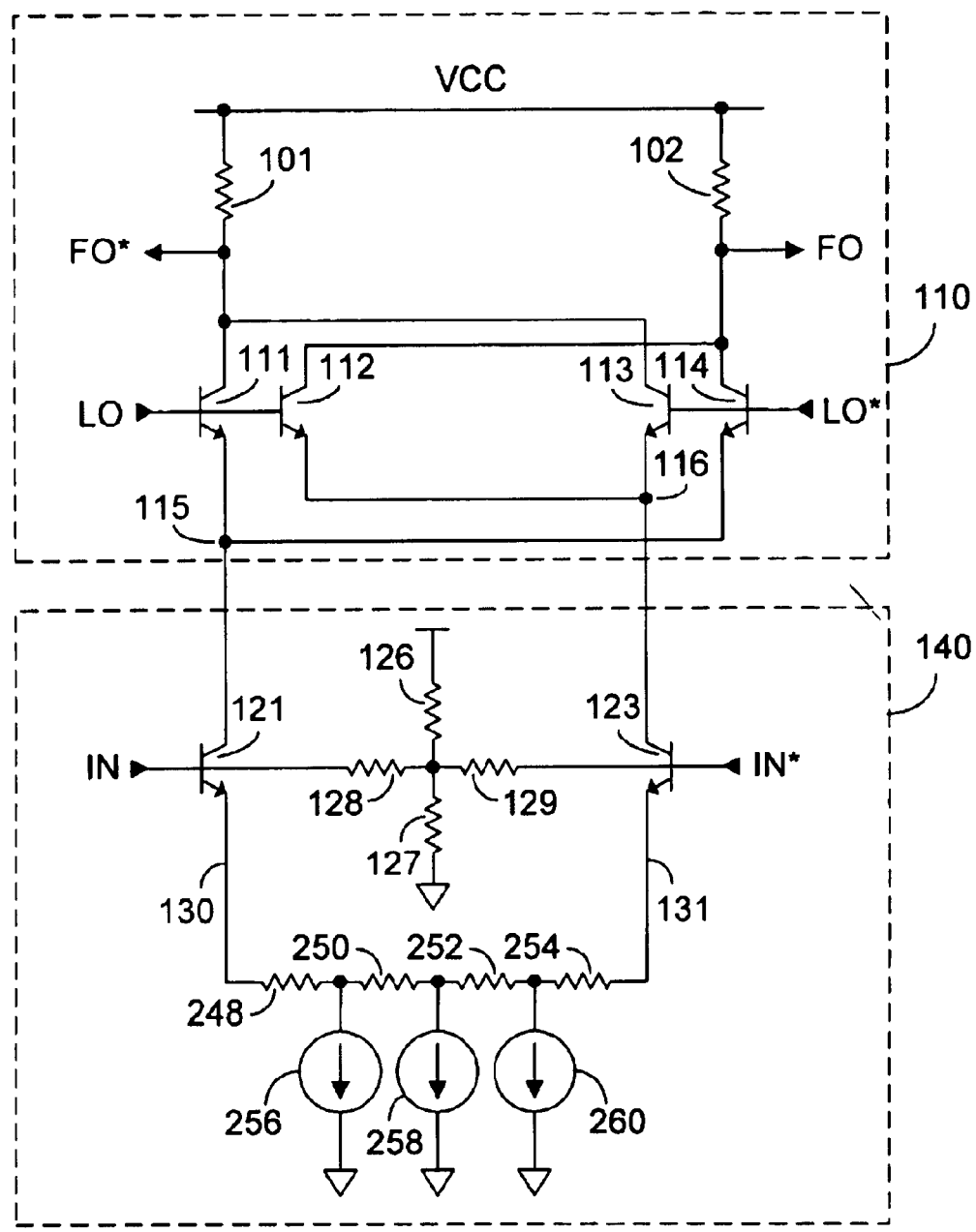
FIG. 12 is a circuit schematic of a directly compensated mixer according to an embodiment of the invention.

FIG. 12 shows a mixer circuit according to another embodiment of the present invention. Compensation for a DC current differential is achieved by applying the current sink at an appropriate location within a resistor network in a differential amplifier circuit of the mixer. The impedance devices and switching circuit 110 are the same as in FIG. 2, and correspondingly, its components are also the same. However, a novel differential amplifier circuit 140 of FIG. 12 incorporates modifications in the input circuit 120 of FIG. 2. Transistors 121, 123 and resistors 128, 129, 127 and 126 remain the same as the corresponding elements of FIG. 2. A resistor network including resistors 248, 250, 252 and 254 are serially connected between the emitters of transistors 121 and 123. Current sink 256 has a first terminal connected to the shared terminal of resistors 248 and 250. Current sink 258 has a first terminal connected to the shared terminal of resistors 250 and 252. Current sink 260 has a first terminal connected to the shared terminal of resistors 252 and 254.

The second terminals of current sinks 256, 258 and 260 are connected to VEE, or ground. Current sinks 256, 258 and 260 are three of a set of identical current sinks, of which only one is selectively enabled. Therefore, if a DC current differential is generated, either one of current sinks 256 and 260 is turned on and additional resistance is effectively introduced into branches 130 or 131 to reduce the DC current of one branch. Otherwise, the centrally positioned current sink 258 is turned on and the existing DC current differential, if any, is maintained. In other words, current branches 130 and 131 can have one of three different resistance values. Table 1 summarises the different resistors that are included within each branch depending on the current sink selected.

TABLE 1

| Current sink selected | Resistors of branch 130 | Resistors of branch 131 |
| --- | --- | --- |
| 258 | 248, 250 | 252, 254 |
| 256 | 248 | 250, 252, 254 |
| 260 | 248, 250, 252 | 254 |

In one scheme, the resistors of the resistor network have the same values. In an example of another scheme, the resistors in both branches originating at the centrally positioned current sink have identical, incremental values. In practice, it is preferred to have a large number of current sinks, such as twenty for example. Standard logic can be implemented on-chip for selecting the appropriate current sink that produces a branch having the lowest amount of mixer LO leakage. In the present embodiment, it is seen that the functional mixer circuit resulting from the selected current sink would effectively be the same as a conventional mixer circuit. It would thus have the advantage in of behaving the same as a conventional mixer, but would not be adding extra noise or parasitics to the system. In an alternate embodiment, a single current sink is used with switches for connecting the current sink to the desired node in the resistor network of the differential amplifier circuit 140. In another alternate embodiment, a single current sink is used, and each resistor of the resistor network has an anti-fuse element connected in parallel with the resistor terminals. Therefore, any resistor is shorted out by blowing its anti-fuse, and resistance is thus removed from the current branches.

Other embodiments of mixers incorporating modifications to input circuits include those that employ input circuits based on those of FIGS. 3 and 4. More specifically, the current sinks are independently variable to reduce the DC current differential between the switching circuit nodes 115 and 116.

FIGS. 8 to 12 show embodiments of direct compensator circuits for controlling the DC current differential in the amplifier circuit. In other words, the compensator circuits are always electrically connected to the amplifier circuit in some way such that the DC current differential is reduced to reduce the LO leakage output power. Although LO leakage output power is reduced using the previously described embodiments of the present invention, there is the possibility that additional parasitics and noise are introduced into the amplifier circuit by the compensator circuit through its electrical connections.

The following embodiments of the present invention reduce the DC current differential in the amplifier circuit indirectly, by raising the local temperature around the amplifier circuit. The DC current differential is reduced indirectly because the compensator circuits of the following embodiments are not electrically connected to the mixer circuit. Since all components on an integrated circuit have a temperature coefficient, meaning that the characteristics of the component changes with the temperature, the current flowing through these components is controlled if the temperature of the component is correspondingly controlled. A method for generating heat in integrated circuits is in dissipate power, predominantly in the form of heat, by taking advantage of their resistance to current. Therefore, through placement of controlled power dissipation elements near the input circuit of the mixer, localized heating changes the current carrying capacity of its components and any DC current differential is reduced.

Figure 13:
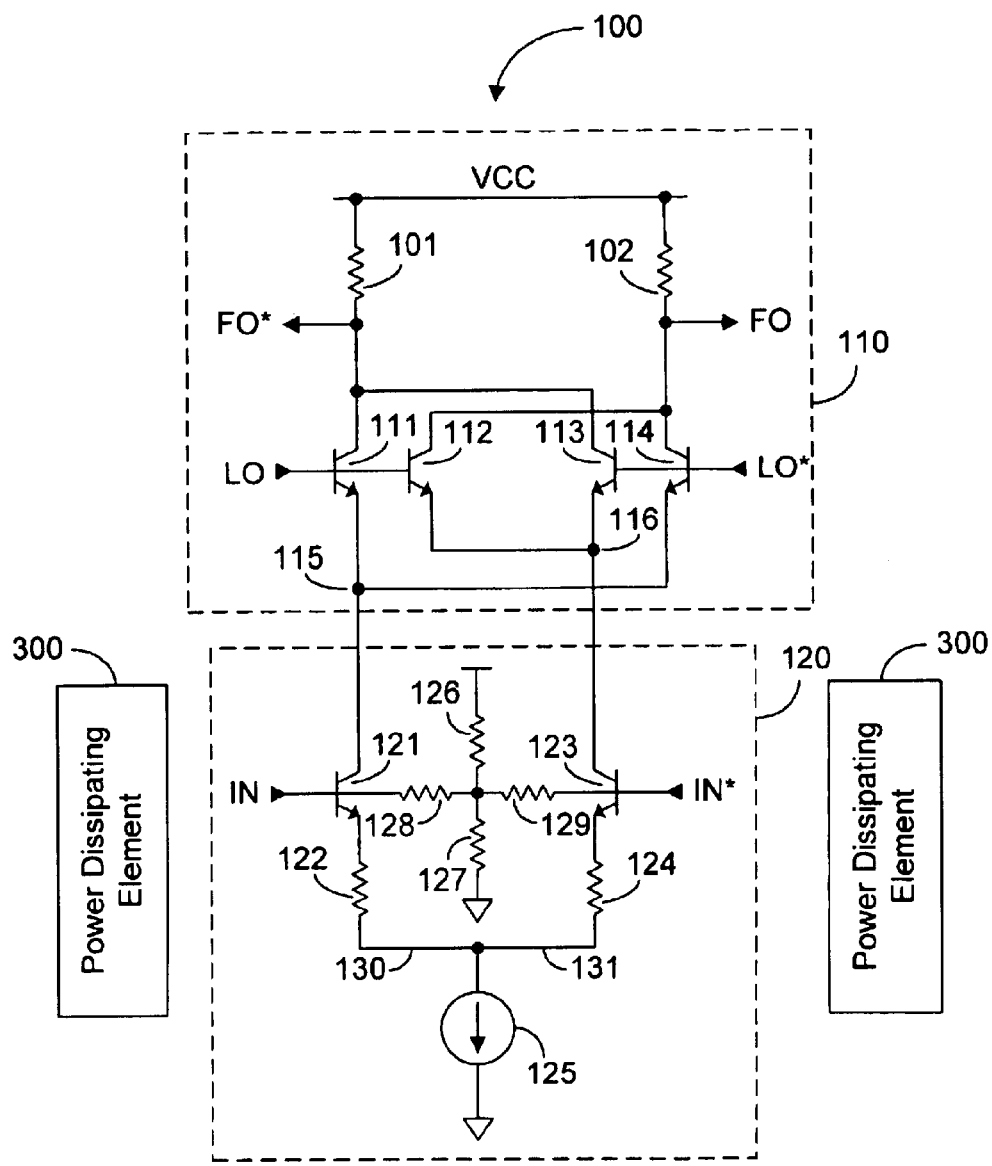
FIG. 13 is a circuit schematic of an indirectly compensated mixer according to an embodiment of the invention.

FIG. 13 shows an embodiment of a mixer employing indirect compensator circuits. The switching circuit 110 and input circuit 120 are the same as in FIG. 2, and correspondingly, their components are also the same. The indirect compensator circuits are power dissipating element (PDE) blocks 300 located near the amplifier circuit input transistors 121 and 123. Circuit embodiments of PDE block 300 are discussed later with reference to FIGS. 15 and 16. The PDE blocks 300 are not electrically connected to mixer 100, but are placed close enough to the input transistors 121 and 123, and resistors 122 and 124 such that a small amount of dissipated heat from either PDE block 300 changes their current carrying capacity. More specifically, if the temperature around transistor 121 and resistor 122 is higher than the temperature around transistor 123 and resistor 124, more current is conducted by the warmer components. Therefore, if current branch 130 had lower DC current than current branch 131, the DC current differential is reduced as more DC current flows through the warmer components, and the LO leakage output power is reduced.

Figure 14:
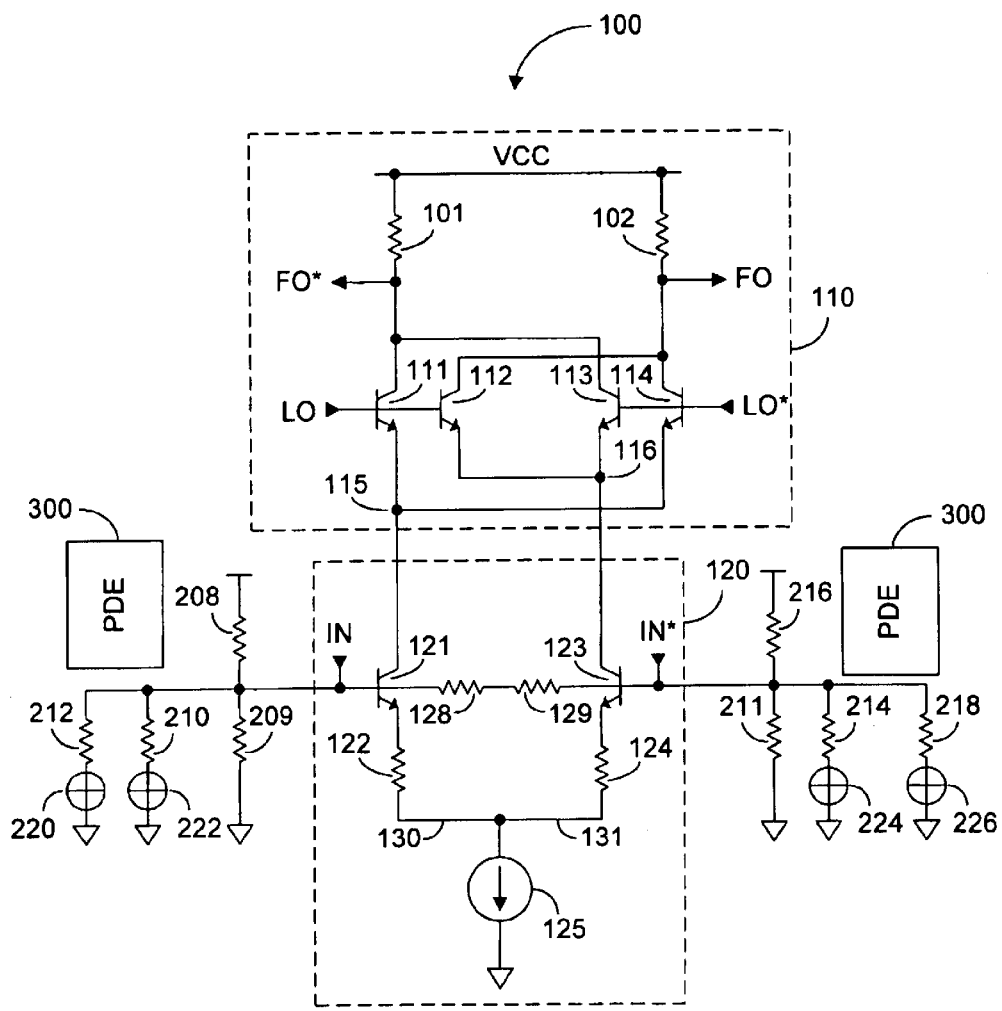
FIG. 14 is a circuit schematic of an indirectly compensated mixer according to an embodiment of the invention.

FIG. 14 shows an embodiment of the indirect compensator circuit used in combination with the direct compensator circuit embodiment of FIG. 9. In the present embodiment, the PDE blocks 300 are placed close to the DC bias resistors 208 and 216 respectively to change their temperatures. Hence, by changing the temperature of resistors 208 and 216, the DC bias voltage of IN and IN* are also changed. As in the embodiment of FIG. 9, by adjusting this DC bias voltage, the resistive value of input transistors 121 and 123 is also adjusted, which in turn controls the current at nodes 115 and 116. In the embodiment of FIG. 14, if the direct compensator circuit of FIG. 9 provides course adjustment of the DC bias voltage, then the addition of the indirect compensator circuit provides fine DC bias voltage adjustment to complement the direct compensator circuit. In an alternative embodiment, resistors 210, 212, 214, 218 and anti-fuses 220, 222, 224, 226 of the direct compensator circuit are omitted, leaving only the bias resistors 208, 209, 211 and 216. Now only the indirect compensator circuit provides the DC bias voltage control.

Figure 15:
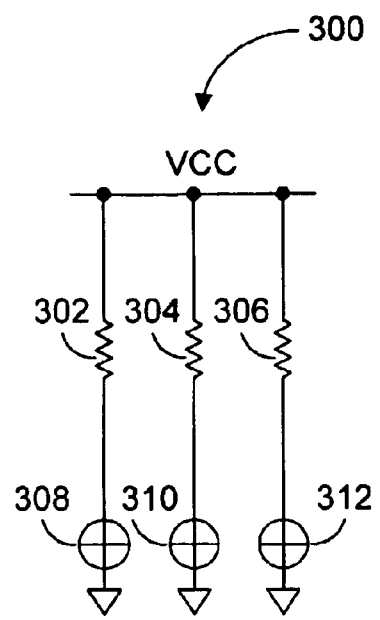
FIG. 15 is a schematic of a power dissipation element according to an embodiment of the invention.
Figure 16:
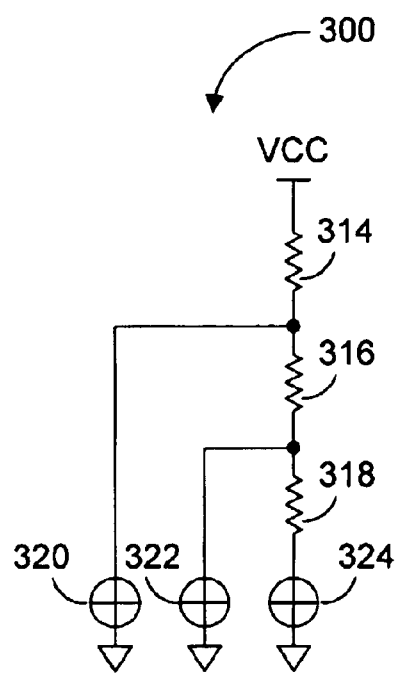
FIG. 16 is a schematic of a power dissipation element according to an embodiment of the invention.

FIGS. 15 and 16 illustrate two differential circuit schematics for PDE block 300 shown in FIGS. 13 and 14. Both employ resistive heating to dissipate power in the form of heat.

The PDE block 300 of FIG. 15 includes three resistors 302, 304, 306 and three anti-fuses 308, 310, 312. Resistor 302 and anti-fuse 308 are serially connected between VCC and ground. Resistors 304, 306 and anti-fuses 310, 312 are also respectively connected in series between VCC and ground. Any blown anti-fuse results in a current flowing through its respective resistor, since VCC is shorted to ground through the resistor. As current flows through the resistor, power is dissipated in the form of heat. Accordingly, any one or more of anti-fuses 308, 310 and 312 can be selectively blown so that the PDE block 300 dissipates more or less heat. Although three resistors are shown in the PDE block 300 of FIG. 15, a plurality of resistor and anti-fuse circuit combinations in the form of a parallel resistor array can be used to provide finer control over the amount of dissipated power. Additionally, the resistor values can either be the same, or differ in incrementally known values.

The PDE block 300 of FIG. 16 includes three resistors 314, 316, 318 and three anti-fuses 320, 322, 324. Unlike the embodiment of FIG. 15, resistors 314, 316, 318 and anti-fuse 324 are connected in parallel between VCC and ground. Anti-fuse 320 has one terminal connected to the shared terminal of resistors 314 and 316, and a second terminal connected to ground. Anti-fuse 322 has one terminal connected to the shared terminal of resistors 316 and 318, and a second terminal connected to ground. Only one of the three fuses is blown to select the number of resistors current is to flow through. For example, if anti-fuse 324 is blown, the total resistance as seen by the circuit is the sum of the resistance of resistors 314, 316 and 318. If anti-fuse 320 is blown, the total resistance is just the resistance of resistor 314. Naturally, more power is dissipated when the total resistance of the circuit is lower, provided that the supply voltage remains constant. This relationship is shown by the equation for power, $P = V^2/R$, where P is the dissipated power, V is the supply voltage and R is the total resistance. The PDE block 300 of FIG. 16 is not limited to the three resistors shown, and can have a plurality of resistors of the same or different values, connected in series with anti-fuses connected at the appropriate terminals.

The previously mentioned methods for testing each resistor/anti-fuse connection combination prior to permanent connection are also applicable to the PDE blocks 300 shown to FIGS. 15 and 16.

In order for the PDE circuits of FIGS. 15 and 16 to provide a wide range of power dissipation levels, many resistors and anti-fuse components are required, which can occupy significant chip area.

Figure 17:
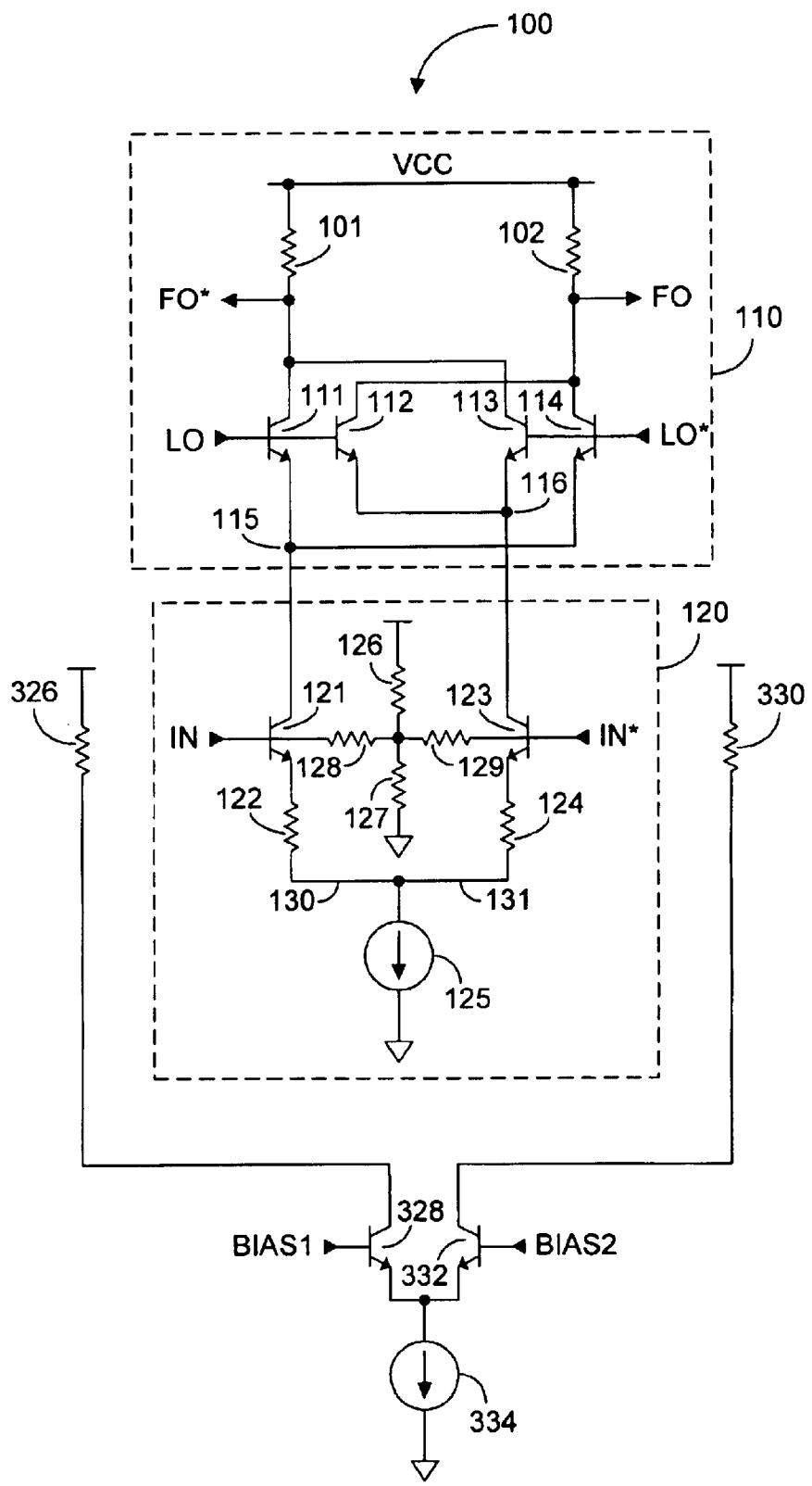
FIG. 17 is a circuit schematic of an indirectly compensated mixer according to an embodiment of the invention.

FIG. 17 shows an embodiment of an indirect compensator circuit used with the conventional mixer circuit of FIG. 2. The indirect compensator circuit of FIG. 17 does not require many resistor components, while providing a range of power dissipation levels. The indirect compensator circuit of the present embodiment includes a current sink 334, bias transistors 328 and 332, and resistors 326 and 330. Current sink 334 has a first terminal connected to the common emitters of bias transistors 328 and 332, and a second terminal connected to VEE, typically ground. The collectors of transistors 328 and 332 are connected to one terminal of resistors 326 and 330 respectively, and their bases are connected to bias voltages BIAS1 and BIAS2 respectively. The second terminal of resistors 326 and 330 are connected to VCC. Resistors 326 and 330 are not electrically connected to mixer 100, but are placed close enough to the input transistors 121 and 123, and resistors 122 and 124 such that a small amount of dissipated heat from either resistor 326 and 330 changes their current carrying capacity. The amount of current that flows through resistors 326 and 330 is controlled by bias voltages BIAS1 and BIAS2 through transistors 328 and 332 respectively. When the current flowing through one of resistors 326 and 330 increases, power dissipation in the form of heat also increases. Bias voltages BIAS1 and BIAS2 can be controlled in the same manner as described for the previous mixer embodiments. Therefore, a range of power dissipation levels can be provided by each of resistors 326 and 330 to reduce the LO leakage output power to acceptable levels.

With an understanding of the contribution to mixer LO leakage by the DC current differential entering the switching circuit, it becomes possible to sense or measure the offset current directly or indirectly as it is being produced by a mixer with an appropriate sensing or measuring means. Such measurement may be acted upon in some appropriate way, such as by providing a precise compensating current to reduce or eliminate the offset current. Or, alternatively, the offset current could be measured directly or indirectly and compensated directly during manufacture of the mixer, thus possibly eliminating any testing and adjusting steps as additional steps. Or, still further, it becomes possible to measure and compensate for the offset current during actual use of the part. This might have great value where the part is to be used in extreme conditions where effects on the circuit may be difficult in anticipate. Finally, it becomes possible to design a mixer according to the invention which is self adjusting, which directly or indirectly measures its own offset current value and chooses an appropriate compensating measure.

Thus many different ways may be arranged to provide a compensating current. The particular way chosen would depend for example on the use of the mixer and cost considerations. As shown in the various embodiments of the present invention, the DC current differential is reduced both by continuously adjustable variations and by providing adjustment in one or more discrete steps through direct or indirect compensator circuits.

Mixers according to the present invention open up several advantages. By incorporating a compensator circuit in the mixer, it is possible to ensure that a larger number of mixers will meet specification requirements. Further, if mixer LO leakage output power is reduced or eliminated, it may be possible to dispense with some components in a given radio frequency system, thus making the design of the system less complex and less expensive. For example, reduction of mixer LO leakage output power can allow omission of at least one filter from a system. The omission of that filter would then permit dispensing with an amplifier, since the unfiltered signal is now strong enough to be processed without as much amplification. The absence of, or reduction in the mixer LO leakage output power can permit use of less sensitive or less sophisticated components in other parts of the circuit with a resultant cost reduction and possibly greater product reliability. Another advantage is that the mixers of the present invention can give greater reliability to a product. Thus by permitting a mixer to be brought well within given specification requirements, rather than being at the limit of those requirements, it means that in unforeseen use situations, such as at extreme temperatures, the risk of product failure is reduced.

With each unneeded component there would be a corresponding reduction in cost and a corresponding reduction in design complexity. Also, some products previously thought to be impractical may come within reach.

The invention has been illustrated with reference to mixers in transmitter circuits, however it will be readily seen by anyone skilled in the art that the mixers according to the invention can be used in any circuit.

Of course, numerous variations and adaptations may be made in the particular embodiments of the invention described above, without departing from the spirit and scope of the invention, which is defined in the claims.

The mixers of the invention are useful at both high and low frequencies. They can be used in an upconverter with lower input frequencies where the resulting output frequencies are closer together and more difficult to filter out.

Standard fuses, fuse controlled transistors, or digital logic controlled transistors are suitable substitutes for the anti-fuses shown in the various embodiments of the invention. The impedance devices shown in the mixer embodiments of the present invention can be resistors, diode connected transistors, or any suitable load device. While the mixer circuit embodiments of the present invention have been implemented with npn bipolar junction transistors, pnp bipolar junction transistors can be used instead, with appropriate modifications to invert the voltage supplies of the circuits. Additionally, bipolar junction transistors can be substituted with heterojunction transistors (HBT), or MOSFET transistors. The resistors of the compensator circuit embodiments can be formed as doped polysilicon or diffusion lines. The configuration of the resistors and anti-fuses shown in FIG. 16 can be substituted for the parallel resistor arrays described for the compensator embodiments. The bias voltage signals used in the compensator embodiments of FIGS. 10, 11 and 17 can be digital logic levels, incremental voltage levels or continuously adjustable voltages supplied on or off-chip.

Although the compensator circuit embodiments of FIGS. 8 through 11, 13, 14 and 17 are used with a differential amplifier input circuit, they are equally applicable to mixers using the conventional input circuits shown in FIGS. 3 and 4. Additionally, the compensator circuit embodiment of FIG. 11 is equally applicable to mixers using the conventional balun input circuits shown in FIGS. 5 and 6.

The methods described for testing resistor connection combinations prior to permanent connection are applicable to any compensator embodiment in which a plurality of resistors are selectively connected to ground. Alternatively, the resistors can be selectively connected to VCC instead of ground, provided that the mixer circuit has been designed to account for this variation.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A mixer for a radio frequency circuit, comprising:
    an input circuit connected to complementary data inputs, for providing currents on a first and second output node, respectively;
    a switching circuit connected to complementary local oscillator inputs and the first and second output nodes for driving complementary mixer output nodes; and
    a compensator circuit for controlling a DC current differential between the first and second output nodes to reduce local oscillator leakage power at the complementary mixer output nodes.

2. The mixer according to claim 1, wherein the input circuit includes a differential pair having first and second current branches.

3. The mixer according to claim 2, wherein the first and second branches receive current from first and second current sinks respectively.

4. The mixer according to claim 3, wherein the first and second current sinks are variable for controlling the DC current differential.

5. The mixer according to claim 2, wherein the compensator circuit selectively changes the resistance of at least one of the first and second current branches.

6. The mixer according to claim 1, wherein the switching circuit includes a switching quad.

7. The mixer according to claim 1, wherein the compensator circuit is connected to the first and second output nodes.

8. The mixer according to claim 7, wherein the compensator circuit injects current into at least one of the first and second output nodes.

9. The mixer according to claim 8, wherein the compensator circuit includes at least one transistor and at least one current sink connected to a voltage supply for controlling the injected current.

10. The mixer according to claim 9, wherein the at least one transistor receives a bias voltage.

11. The mixer according to claim 9, wherein the at least one transistor includes an npn BJT, and the voltage supply is VEE.

12. The mixer according to claim 9, wherein the at least one transistor includes a pnp BJT, and the voltage supply is VCC.

13. The mixer according to claim 1, wherein the compensator circuit is connected to the complementary data inputs.

14. The mixer according to claim 5, wherein the compensator circuit changes a DC voltage level of the complementary data inputs.

15. The mixer according to claim 14, wherein the compensator circuit includes at least one resistor for selectively connecting to ground.

16. The mixer according to claim 15, wherein the compensator circuit includes an anti-fuse for selectively connecting the at least one resistor to ground.

17. The mixer according to claim 14, wherein the compensator circuit includes a buffer circuit.

18. The mixer according to claim 17, wherein the buffer circuit includes a differential pair.

19. The mixer according to claim 1, wherein the compensator circuit includes at least one power dissipation element for generating heat.

20. The mixer according to claim 19, wherein the at least one power dissipation element includes at least one resistor connected to VCC for selectively connecting to ground.

21. The mixer according to claim 20, wherein the at least one power dissipation element includes an anti-fuse for selectively connecting the at least one resistor to ground.

22. The mixer according to claim 20, wherein the at least one power dissipation element includes at least one transistor and at least one current sink serially connected between the resistor and ground.

23. The mixer according to claim 22, wherein the at least one transistor receives a bias voltage.

24. The mixer according to claim 1, wherein the input circuit includes a balun circuit.

25. The mixer according to claim 1, wherein the input circuit includes a common base pair.

26. The mixer according to claim 25, wherein the common base pair includes first and second current sinks.

27. The mixer according to claim 26, wherein the first and second current sinks are variable for controlling the DC current differential.

28. A radio frequency transmitter, comprising:
    a digital to analog converter for receiving digital data and generating an analog data signal corresponding to the digital data;
    a filter for receiving the analog data signal and providing a filtered data signal; and a mixer for changing the frequency of the filtered data signal in accordance with a high frequency local oscillator, and for providing a high frequency data signal, the mixer including:
  an input circuit connected to complementary data inputs, for providing currents on a first and second output node, respectively;
  a switching circuit connected to complementary local oscillator inputs and the first and second output nodes for driving complementary mixer output nodes;
  a compensator circuit for controlling a DC current differential between the first and second output nodes to reduce local oscillator leakage power at the complementary mixer output nodes; and
an antenna for transmitting the high frequency data signal.

* * * * *